US005885882A

United States Patent [19]

Schugraf et al.

[11] Patent Number: 5,885,882

[45] Date of Patent: Mar. 23, 1999

[54] METHOD FOR MAKING POLYSILICON ELECTRODE WITH INCREASED SURFACE AREA MAKING SAME

[75] Inventors: Klaus F. Schugraf; Randhir P. S. Thakur, both of Boise, Id.

[73] Assignee: Micron Technology, Inc., Boise, Id.

[21] Appl. No.: 503,708

[22] Filed: Jul. 18, 1995

[51] Int. Cl.$^{6}$ .................... H01L 21/8242

[52] U.S. Cl. .................... 438/398; 438/255

[58] Field of Search .................... 437/52, 60, 919, 437/977; 148/DIG. 138; 438/253, 255, 398

[56] References Cited

U.S. PATENT DOCUMENTS

| | | | |
|---|---|---|---|
| 5,102,832 | 4/1992 | Tuttle | 438/398 |
| 5,112,773 | 5/1992 | Tuttle | 438/398 |
| 5,254,503 | 10/1993 | Kenney | 438/398 |
| 5,256,587 | 10/1993 | Jun et al. | 438/253 |
| 5,302,540 | 4/1994 | Ko et al. | 438/255 |
| 5,366,917 | 11/1994 | Watanabe et al. | 438/398 |
| 5,658,381 | 8/1997 | Thak et al. | 438/398 |
| 5,702,968 | 12/1997 | Chen . | |
| 5,760,434 | 6/1998 | Zahurak et al. | 438/398 |

*Primary Examiner*—Peter Toby Brown
*Assistant Examiner*—Toniae M. Thomas
*Attorney, Agent, or Firm*—Reed Smith Shaw & McClay LLP

[57] ABSTRACT

An electrode structure for use on an integrated circuit, and a method for forming the same. The electrode structure is formed by depositing a polysilicon layer on a dielectric layer. The polysilicon layer is then annealed until a plurality of non-contiguous polysilicon clusters are formed. Each of the non-contiguous polysilicon clusters has a base end and a top end. The base ends of the non-contiguous clusters are preferably separated by a spacing (S). Following the annealing step, the non-contiguous polysilicon clusters are connected electrically by depositing a conductive layer having a thickness (T) over the annealed polysilicon layer. The spacing (S) is preferably greater than twice the thickness (T).

7 Claims, 2 Drawing Sheets

20b
30
24
$S_2$
10

METHOD FOR MAKING POLYSILICON ELECTRODE WITH INCREASED SURFACE AREA MAKING SAME

FIELD OF THE INVENTION

The present invention relates to integrated circuit structures and, more particularly, to capacitor structures used with dynamic random access memory ("DRAM") cells formed on semiconductor integrated circuits.

BACKGROUND

The miniaturization of electrical components and their integration on a single piece of semiconductor material has been the catalyst for a world wide information revolution. As integrated circuit technology has progressed, it has been possible to store increasing amounts of digital data in a smaller space at less expense and still access the data randomly, quickly and reliably. Central to this increased ability to store and retrieve data has been the dynamic random access memory, or DRAM, fabricated as an integrated circuit.

In the case of mass produced DRAMs, the cost per bit of memory has historically decreased as the number of bits which can be reliably stored on each integrated circuit has increased. Thus, it is advantageous to pack as many bit-storing memory cells as possible on each square unit of planar surface area available on a semiconductor integrated circuit.

DRAMs are formed of a large number of storage nodes which require transistors and capacitors in order to store information. The state of the art of fabricating the storage nodes of DRAM circuits has progressed to the point where the transistors of the nodes can be made much smaller than the capacitors.

In order to function properly within the nodes, the capacitors must possess a minimum amount of capacitance. If a capacitor exhibits too little capacitance, it loses the charge placed upon it too rapidly, causing errors in data storage. Thus, it is essential that the electrodes of storage node capacitors be large enough to retain an adequate charge in spite of parasitic capacitances and noise that may be present during circuit operation. Generally, it is desirable that each memory cell capacitor have as much capacitance as possible, but at least $20\times10^{-15}$ farads, and preferably more than $60\times10^{-15}$ farads of charge storage capacity.

The capacitance value, C, of a capacitor is dependent upon the dielectric constant, $\epsilon$, of the material placed between the electrodes of the capacitor, the distance, d, between the electrodes, and the effective surface area, A, of the electrodes. The relationship may be expressed $C=A\epsilon/d$. In many cases the material used as the dielectric between the electrodes of the capacitor is limited to only a few possibilities. Also, the minimum distance between the capacitor electrodes is generally limited to a particular value in order for the number of fabrication defects to be kept to an acceptably low value. Thus, the parameter which can most easily be varied to obtain increased storage capacity in DRAM capacitors is the surface area of the capacitor electrodes.

Therefore, it is a goal of DRAM designers to increase the surface area of capacitor electrodes as much as possible. It is also a goal to reduce the planar area occupied by each capacitor to a minimum so that as many memory cells as possible can be packed onto a single integrated circuit. Various three dimensional structures have been proposed and adopted in the art of DRAM fabrication to maintain the value of capacitors at a high level while keeping the planar area, or footprint, allocated to the capacitor at a minimum Among the proposed methods for maintaining cell capacitance while decreasing the planar area devoted to the cell capacitor is a "trench transistor cell," such as that described in Lu, "Advanced Structures for Dynamic RAMs", IEEE Circuits and Devices Magazine, pp. 27–35, (January 1989). In the trench transistor cell of the Lu paper, the capacitor cell is a vertical structure with an access transistor which is also vertical. The access transistor is placed above the cell capacitor. The described trench cell provides greater capacitor electrode area in a small planar area when compared to many planar capacitor structures. However, it provides only a modest increase in charge storage capacity, as well as additional difficulties during fabrication.

It is well known in the art that the storage capacitance of a node capacitor can be enhanced without increasing either the area required for the cell or the storage electrode height by "roughening" the silicon used to form a storage node electrode. In this method, a relatively flat silicon layer is subjected to surface migration and grain growth until the silicon layer forms into rounded clusters. An increase in capacitance results because the surface area of the rounded silicon clusters is greater than that of a relatively flat silicon layer. In this method (illustrated in FIGS. 1 and 2), one plate of the capacitor may be formed by initially depositing an amorphous silicon layer 20 on a dielectric layer 10. Next, the structure shown in FIG. 1 may be patterned and cleaned, and then subjected to an annealing process during which surface migration and grain growth of the amorphous silicon layer occurs. The surface migration and grain growth that occurs during the annealing step results in the formation of connected clusters 20*a* in the polysilicon layer 20, as shown in FIG. 2. The clustering shown in FIG. 2 serves to increase the surface area of the capacitor plate (thereby increasing the capacitance of the cell), while maintaining as constant the planar area devoted to the cell.

As an improvement to the process shown in FIG. 2, it would be desirable to further increase the surface area of the capacitor plate by annealing the polysilicon layer 20 until the clusters 20*a* grow to a size larger than that shown in FIG. 2. Unfortunately, such further annealing of the polysilicon layer 20 results in polysilicon clusters 20*b* that grow to a point at which they are no longer connected to each other (shown in FIG. 3). Once the polysilicon clusters 20*b* separate from each other, the polysilicon layer 20 no longer represents a single electrode and therefore has little utility as a capacitor plate.

SUMMARY OF THE INVENTION

It is an object of the present invention to provide a capacitor plate with an increased surface area by annealing a polysilicon layer until clusters having a maximum surface area are formed.

It is a further object of the present invention to provide a capacitor plate that can be formed from disconnected or non-contiguous polysilicon clusters.

It is another object of the present invention to provide an integrated circuit capacitor structure and method for forming such an integrated circuit capacitor structure which can be reliably manufactured and operated.

It is another object of the present invention to provide an integrated circuit capacitor structure and a method for forming such an integrated circuit capacitor structure which is particularly adapted for integration into DRAM integrated circuits.

These and other objects and advantages of the invention will become more filly apparent from the description and claims which follow or may be learned by the practice of the invention.

The present invention is directed to an electrode structure for use on an integrated circuit, and a method for forming the same. The electrode structure is formed by depositing a polysilicon layer on a dielectric layer. The polysilicon layer is then annealed until a plurality of non-contiguous polysilicon clusters are formed. Each of the non-contiguous polysilicon clusters has a base end and a top end. The base ends of the non-contiguous clusters are preferably separated by a spacing ($S_1$). Following the annealing step, the non-contiguous polysilicon clusters are connected electrically by depositing a conductive layer having a thickness (T) over the annealed polysilicon layer. The spacing (S) is preferably greater than twice the thickness (T).

BRIEF DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof will be described and explained with additional specificity and detail through the use of the accompanying drawings.

DETAILED DESCRIPTION OF THE PREFERRED EMBODIMENT

Figure 1:
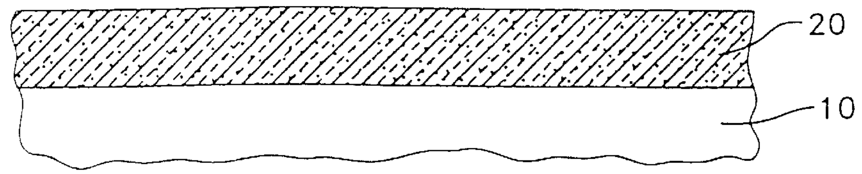
FIG. 1 is a cross-sectional diagram of a structure formed of a dielectric layer on which is deposited a polysilicon layer.
Figure 2:
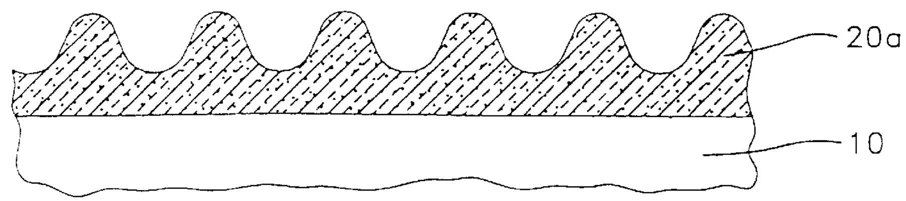
FIG. 2 is a cross-sectional diagram of a polysilicon electrode structure formed from the structure of FIG. 1, in accordance with the prior art.

Reference will now be made to the drawings wherein like structures are provided with like reference designations. It will be understood that the drawings included herewith only provide diagrammatic representations of the presently preferred structures of the present invention and that structures falling within the scope of the present invention may include structures different than those shown in the drawings.

Figure 3:
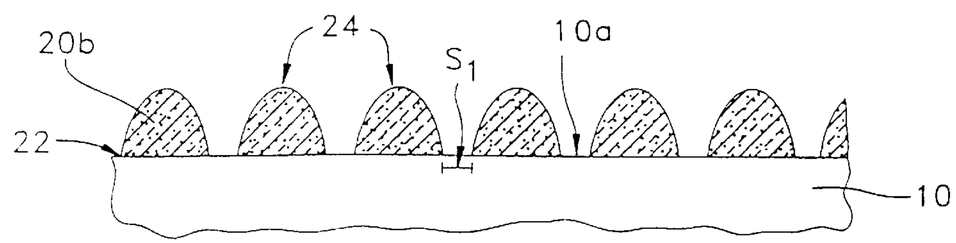
FIG. 3 is a cross-sectional diagram of a polysilicon layer formed of non-contiguous polysilicon clusters which have been formed by annealing the structure of FIG. 1, in accordance with a preferred embodiment of the present invention.

Referring now to FIG. 1, there is shown a cross-sectional diagram of structure formed using a dielectric layer 10 on which is deposited a polysilicon layer 20. Layer 20 is preferably formed using amorphous silicon and has a thickness greater than 150 angstroms. In order to form a polysilicon electrode in accordance with a preferred embodiment of the present invention, the structure of FIG. 1 is initially annealed so as to cause the formation of clusters **20*b* within polysilicon layer 20. Thus, as shown in FIG. 3, the annealing step continues until non-contiguous clusters 20*b* have been formed on dielectric layer 10. Clusters 20*b* are considered to be "non-contiguous" in that clusters 20*b* do not touch or contact each other and are therefore electrically separated from each other by regions 10*a*. Each of the non-contiguous clusters 20*b* has a base end 22 positioned adjacent to dielectric layer 10, and a rounded top end 24 positioned opposite base end 22**.

In the preferred embodiment shown in FIG. 3, the annealing step continues until the bases 22 of adjacent non-contiguous clusters **20*b* are separated by regions 10*a*. The width of each region 10*a* corresponds to a spacing ($S_1$) between adjacent clusters 20*b*. Thus, the annealing step includes controlling the temperature, pressure and time during which layer 20 is annealed so as to cause the silicon within layer 20 to migrate and form clusters 20*b* with spacing ($S_1$). The formation of clusters 20*b* is preferably accomplished by seeding layer 20 with a hydride or an organic material that will cluster, and then annealing the seeded polysilicon layer at 570° C. and 50 milli-torr for a period of at least 1 minute. It will be understood by those skilled in the art that other temperatures, pressures, and times may be used to anneal layer 20, and that such variations are within the scope of this invention so long as the annealing step used yields non-contiguous clusters 20*b* separated by spacing ($S_1$). Although in the preferred embodiment clusters 20*b* are formed after layer 20 has been deposited on dielectric layer 10 by seeding and then annealing a polysilicon layer 20 as explained above, in an alternative embodiment clusters 20*b* may be formed at the same time that layer 20*b* is deposited onto dielectric layer 10**.

Following the formation of clusters **20*b*, a thin conductive layer 30 (shown in FIG. 4) is deposited over the top of clusters 20*b* and regions 10*a* of layer 10. Thin conductive layer 30 is preferably formed of a doped polysilicon, and preferably has a thickness (T) between 10–200 angstroms. In a still further preferred embodiment, the thickness (T) of layer 30 will be roughly 100 angstroms. Exemplary dopants that may be used to form layer 30 include $PH_3$ and $AsH_3$, although other dopants may also be used. In the preferred embodiment, a chemical vapor deposition ("CVD") procedure is used to apply layer 30 to the structure shown in FIG. 3. This CVD step is preferably performed at a temperature of between 400°–780° C. In a still further preferred embodiment, the temperature used for the CVD step is approximately 525° C. It will be understood by those skilled in the art that a CVD step may be used to deposit a single doped polysilicon layer 30 or, alternatively, an undoped polysilicon layer may be initially deposited followed by the application to the undoped layer of a dopant such as, for example, $PH_3$ or $AsH_3$. In a further alternative embodiment, layer 30 may be formed from a metal such as, for example, Al or TiN, which is deposited over the structure shown in FIG. 3** by a CVD or sputtering process.

In order to maximize the surface area of the electrode formed by the present invention, the spacing ($S_1$) between adjacent cluster bases 22 is preferably greater than twice the thickness (T) of layer 30. Keeping the thickness (T) of layer 30 below this dimension insures that the valleys **30*a* formed between clusters 20*b* are not effectively filled in by the application of layer 30 between clusters 20*b***.

Figure 4:
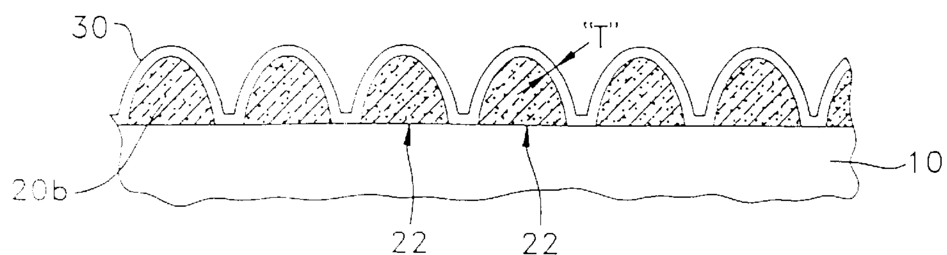
FIG. 4 is a cross-sectional diagram of the structure of FIG. 3, after a conductive layer has been deposited on the non-contiguous polysilicon clusters, in accordance with a preferred embodiment of the present invention.
Figure 5:
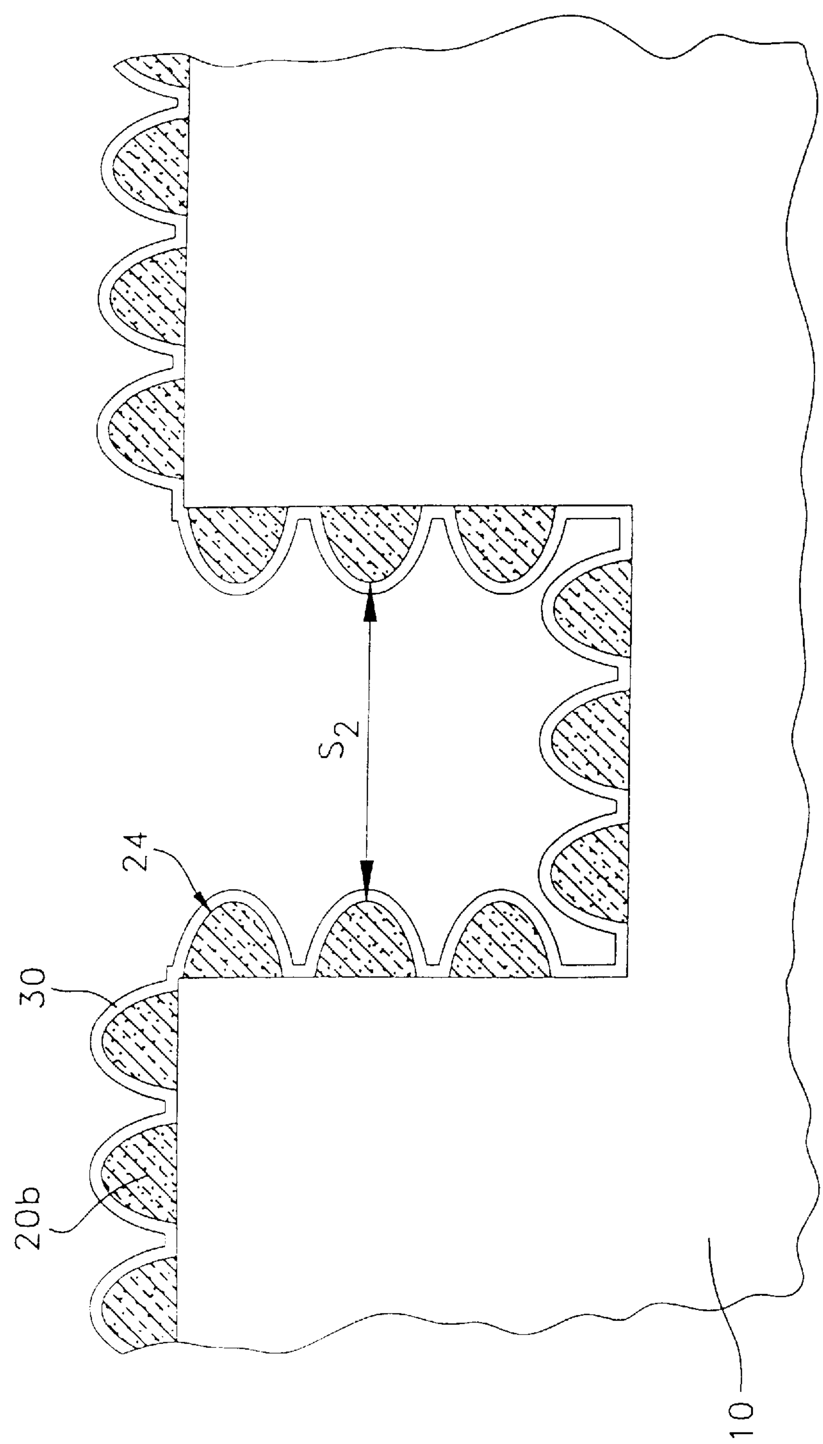
FIG. 5 is a cross-sectional diagram of the structure of FIG. 4 incorporated into a stacked capacitor DRAM storage cell in accordance with a preferred embodiment of the present invention.

Referring now to FIG. 5, there is shown a cross-sectional diagram of the structure of FIG. 4 incorporated into a stacked or container type capacitor DRAM storage cell in accordance with a preferred embodiment of the present invention. The structure shown in FIG. 5 is formed using the same steps set forth above for forming the structure of FIG. 4, except a dielectric layer 10 having a trench or well 10*b* is used as the base layer upon which clusters 20*b* are formed. When the structure shown in FIG. 4 is incorporated into a stacked capacitor, the width of well 10*b* is preferably formed such that the top ends 24 of the clusters are separated by a second spacing ($S_2$) which is greater than twice the thickness (T) of conductive layer 30 deposited on top of the clusters 20*b*. Keeping this second spacing ($S_2$) greater than twice the thickness (T) insures that opposing clusters $\mathbf{20}b_1$, and $\mathbf{20}b_2$ do not become electrically connected to each other when conductive layer 30 is applied on top of such clusters.

Furthermore, it is to be understood that although the present invention has been described with reference to a preferred embodiment, various modifications, known to those skilled in the art, may be made to the structures and process steps presented herein without departing from the invention as recited in the several claims appended hereto.

What is claimed is:

1. A method for forming an electrode structure for use on an integrated circuit, comprising the steps of:

(A) depositing a polysilicon layer onto a dielectric layer shaped in the form of a container having a cylindrical vertical portion and a horizontal end portion perpendicular to said vertical portion;

(B) forming a plurality of non-contiguous polysilicon clusters each of which has a base end and a top end by seeding said polysilicon layer with a clustering material and annealing the seeded polysilicon layer until said base ends of said non-contiguous polysilicon clusters are separated by a first spacing ($S_1$) and said top ends of said non-contiguous clusters on said vertical portion are separated by a second spacing ($S_2$); and (C) electrically connecting said plurality of non-contiguous polysilicon clusters by depositing a conductive layer having a thickness (T) over said polysilicon layer after said annealing of said polysilicon layer;

wherein said first spacing ($S_1$) is greater than (T×2) and said second spacing ($S_2$) is greater than (T×2).

2. The method of claim 1, wherein said polysilicon layer deposited in step (A) is formed using an amorphous silicon.

3. The method structure of claim 1, wherein said conductive layer deposited in step (C) is formed of a doped polysilicon.

4. The method of claim 3, wherein said conductive layer deposited in step (C) has a thickness (T) that is between 10–200 angstroms.

5. The method of claim 3, wherein said doped polysilicon includes a dopant selected from the group consisting of $PH_3$ and $AsH_3$.

6. The method of claim 1, wherein step (C) comprises the steps of:

(1) depositing a layer of undoped polysilicon over said annealed polysilicon layer; and

(2) doping said undoped polysilicon layer with an electrically conductive dopant.

7. The method of claim 1, wherein said electrode structure forms a capacitor plate on said integrated circuit.

* * * * *

UNITED STATES PATENT AND TRADEMARK OFFICE

CERTIFICATE OF CORRECTION

PATENT NO. : 5,885,882

DATED : March 23, 1999

INVENTOR(S) : Klaus E. Schugraf, et al.

It is certified that error appears in the above-identified patent and that said Letters Patent is hereby corrected as shown below:

On the cover page, Item [54], delete entire title and insert therefore --METHOD FOR MAKING POLYSILICON ELECTRODE WITH INCREASED SURFACE AREA--.

Signed and Sealed this

Eighth Day of June, 1999

Attest:

Q. TODD DICKINSON

*Attesting Officer*

*Acting Commissioner of Patents and Trademarks*